United States Patent
Wang et al.

(10) Patent No.: US 9,383,391 B2
(45) Date of Patent: Jul. 5, 2016

(54) VOLTAGE SENSING CIRCUIT

(71) Applicant: HIMAX TECHNOLOGIES LIMITED, Tainan (JP)

(72) Inventors: Jia-Hui Wang, Tainan (TW); Chuan-Chien Hsu, Tainan (TW); Hung-Yu Huang, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 159 days.

(21) Appl. No.: 14/251,195

(22) Filed: Apr. 11, 2014

(65) Prior Publication Data

US 2015/0293156 A1    Oct. 15, 2015

(51) Int. Cl.
| | |
|---|---|
| *G01R 1/30* | (2006.01) |
| *G01R 19/00* | (2006.01) |
| *G01R 19/10* | (2006.01) |
| *H03M 1/12* | (2006.01) |

(52) U.S. Cl.
CPC .............. *G01R 19/0084* (2013.01); *G01R 1/30* (2013.01); *G01R 19/10* (2013.01); *H03M 1/129* (2013.01)

(58) Field of Classification Search
CPC ........ G01R 19/84; G01R 19/10; G01R 19/20; G01R 17/16; G01R 17/02
USPC ...................................... 324/123 R
See application file for complete search history.

(56) References Cited

U.S. PATENT DOCUMENTS

| | | | | |
|---|---|---|---|---|
| 6,285,256 B1 * | 9/2001 | Wong | ..................... | H03F 3/3028 330/255 |
| 6,825,692 B1 * | 11/2004 | Chung | ........... | H03K 19/018585 326/68 |
| 7,102,439 B2 * | 9/2006 | Heightley | ........... | H03F 3/45183 330/253 |
| 2002/0021149 A1 * | 2/2002 | Park | .................... | H03K 3/35613 327/87 |
| 2002/0125950 A1 * | 9/2002 | Abe | ..................... | H03F 3/45219 330/253 |
| 2006/0017503 A1 * | 1/2006 | Benzer | ................... | H03F 3/3022 330/253 |
| 2006/0164143 A1 * | 7/2006 | Hendrickson | ........ | H03K 3/0375 327/199 |
| 2007/0064504 A1 * | 3/2007 | Jeon | ...................... | H04L 25/061 365/189.05 |
| 2007/0090801 A1 * | 4/2007 | Kim | ..................... | G01R 31/362 320/128 |
| 2008/0174343 A1 * | 7/2008 | Cha | ..................... | H04L 25/0292 327/64 |

(Continued)

FOREIGN PATENT DOCUMENTS

| | | |
|---|---|---|
| CN | 1777026 | 7/2011 |
| TW | I248254 | 1/2006 |

(Continued)

OTHER PUBLICATIONS

"Office Action of Taiwan Counterpart Application", issued on Mar. 19, 2015, p. 1-p. 4.

*Primary Examiner* — Tung X Nguyen
*Assistant Examiner* — Dominic Hawkins
(74) *Attorney, Agent, or Firm* — J.C. Patents

(57) ABSTRACT

A voltage sensing circuit is provided. The voltage sensing circuit includes two differential amplifiers and a buffer. The first differential amplifier receives a first input voltage and a first reference voltage and provides a first current and a second current according to the difference between the first input voltage and the first reference voltage. The second differential amplifier receives a second input voltage and a second reference voltage and provides a third current and a fourth current according to the difference between the second input voltage and the second reference voltage. The buffer is coupled to the two differential amplifiers. The buffer generates an output voltage based on the first current, the second current, the third current, and the fourth current.

7 Claims, 4 Drawing Sheets

(56) References Cited

U.S. PATENT DOCUMENTS

| | | | |
|---|---|---|---|
| 2008/0204914 A1* | 8/2008 | Hashizume | G11B 5/022 360/46 |
| 2012/0256670 A1* | 10/2012 | Ding | H03K 5/12 327/175 |
| 2012/0268302 A1* | 10/2012 | Etou | H03M 1/0604 341/161 |
| 2014/0036596 A1* | 2/2014 | Chan | G11C 11/5642 365/185.21 |
| 2014/0184184 A1* | 7/2014 | Yajima | G01R 19/165 323/274 |
| 2014/0232577 A1* | 8/2014 | Noguchi | H03M 1/005 341/118 |

FOREIGN PATENT DOCUMENTS

| | | |
|---|---|---|
| TW | I330457 | 9/2010 |
| TW | I335135 | 12/2010 |
| TW | 201234780 | 8/2012 |

* cited by examiner

VOLTAGE SENSING CIRCUIT

BACKGROUND OF THE INVENTION

1. Field of the Invention

The present invention relates to a voltage sensing circuit. More particularly, the present invention relates to a voltage sensing circuit for differential voltages.

2. Description of the Related Art

Analog-to-digital converter (ADC) is an important component in modern electronic devices. An ADC can convert analog signals into digital signals so that digital circuits, such as processors and microcontrollers, can analyze and process them. Therefore, the ADC has comprehensive applications in modem electronic devices.

An ADC receives a pair of differential signals as input. The difference between the input signals must be within a fixed valid range to ensure proper operation of the ADC. However, the difference between the input signals may deviate beyond the valid range due to abnormal conditions.

SUMMARY OF THE INVENTION

Accordingly, the present invention is directed to a voltage sensing circuit capable of sensing whether a pair of input voltages conforms to a valid range or not.

According to an embodiment of the present invention, a voltage sensing circuit is provided. The voltage sensing circuit includes two differential amplifiers and a buffer. The first differential amplifier receives a first input voltage and a first reference voltage and provides a first current and a second current according to the difference between the first input voltage and the first reference voltage. The second differential amplifier receives a second input voltage and a second reference voltage and provides a third current and a fourth current according to the difference between the second input voltage and the second reference voltage. The buffer is coupled to the two differential amplifiers. The buffer generates an output voltage based on the first current, the second current, the third current, and the fourth current.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
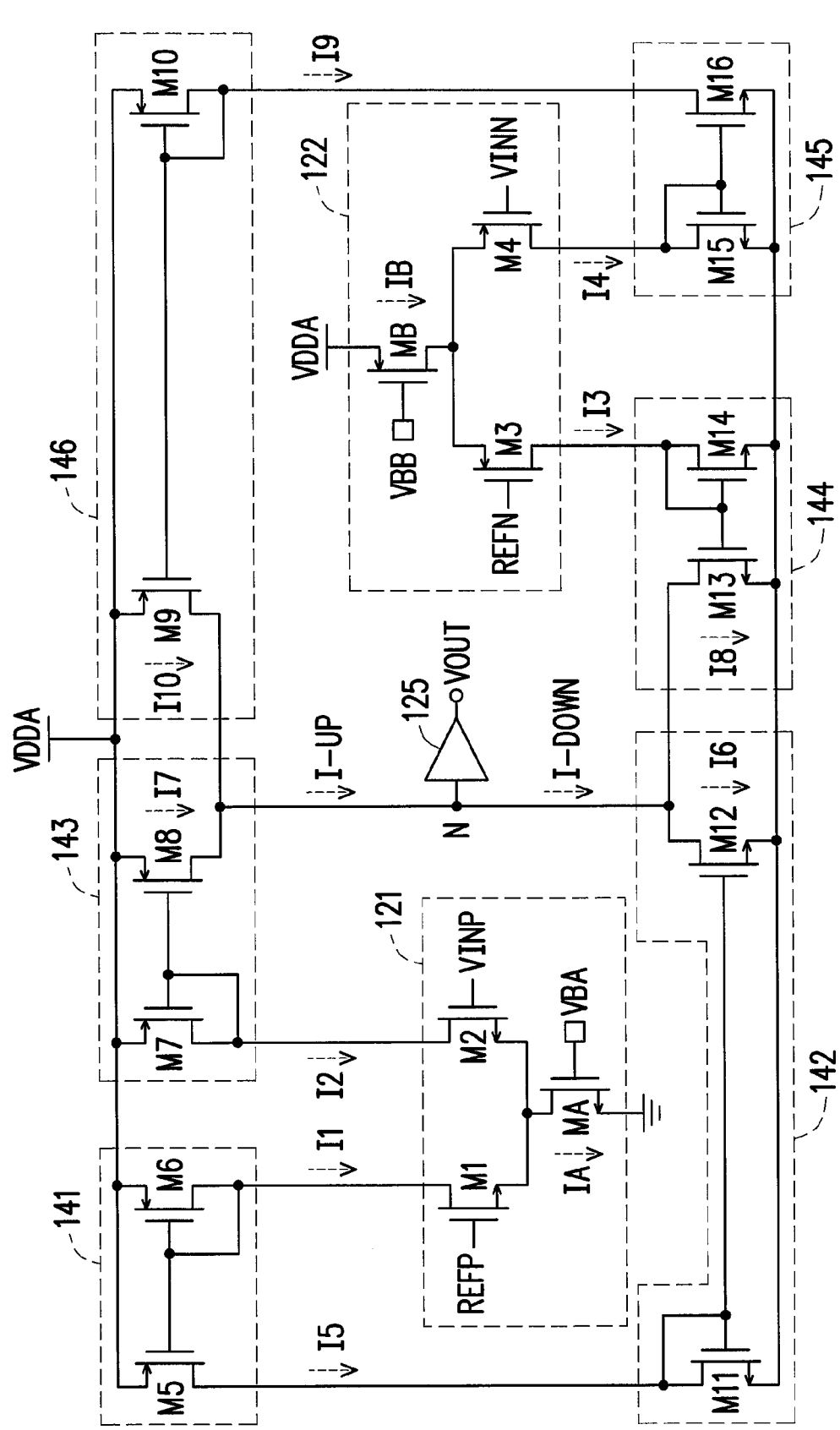
FIG. 1 is a schematic diagram showing a voltage sensing circuit according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic diagram showing a voltage sensing circuit 100 according to an embodiment of the present invention. The voltage sensing circuit 100 receives a pair of differential input voltages VINP and VINN. The voltage sensing circuit 100 also receives a pair of differential reference voltages REFP and REFN. The voltage sensing circuit 100 compares two difference voltages V1 and V2 and generates the output voltage VOUT to indicate the result of the comparison of V1 and V2, wherein V1=REFP−REFN and V2=VINP−VINN.

The voltage sensing circuit 100 includes two differential amplifiers 121 and 122, a buffer 125, and six current mirrors 141-146. The current mirrors 141 and 143 are coupled to the differential amplifier 121. The current mirror 142 is coupled to the current mirror 141.

The current mirrors 144 and 145 are coupled to the differential amplifier 122. The current mirror 146 is coupled to the current mirror 145. The buffer 125 is coupled to the current mirrors 142, 143, 144 and 146.

The differential amplifier 121 receives the input voltage VINP and the reference voltage REFP. The differential amplifier 121 provides two currents I1 and I2. In brief, the differential amplifier 121 converts the difference between the voltages VINP and REFP into the difference between the currents I1 and I2.

The differential amplifier 121 includes n-channel metal-oxide-semiconductor field-effect transistors (NMOS transistors) M1, M2 and MA. The gate of M1 receives the reference voltage REFP. The drain of M1 provides the current I1. The gate of M2 receives the input voltage VINP. The drain of M2 provides the current I2. The NMOS transistor MA is coupled between the sources of M1 and M2 and the ground. The gate of MA receives a constant bias voltage VBA; therefore MA operates as a current source and provides a constant current IA. IA=I1+I2.

When the input voltage VINP becomes smaller than the reference voltage REFP, the current I2 decreases because the gate-to-source voltage of M2 becomes smaller. Accordingly, the current I1 increases because the sum of the currents I1 and I2 is the constant current I1. On the other hand, when the input voltage VINP becomes larger than the reference voltage REFP, the current I2 increases because the gate-to-source voltage of M2 becomes larger. Accordingly, the current I1 decreases because the sum of the currents I1 and I2 is the constant current IA. In summary, the current difference (I2−I1) is directly proportional to the voltage difference (VINP−REFP).

The current mirror 141 includes two p-channel metal-oxide-semiconductor field-effect transistors (PMOS transistors) M5 and M6. The current mirror 141 provides the current I5 according to the current I1. The current mirror 142 includes two NMOS transistors M11 and M12. The current mirror 142 provides the current I6 according to the current I5. The current mirror 143 includes two PMOS transistors M7 and M8. The current mirror 143 provides the current I7 according to the current I2.

The differential amplifier 122 receives the input voltage VINN and the reference voltage REFN. The differential amplifier 122 provides two currents I3 and I4. In brief, the differential amplifier 122 converts the difference between the voltages VINN and REFN into the difference between the currents I3 and I4.

The differential amplifier 122 includes PMOS transistors M3, M4 and MB. The gate of M3 receives the reference voltage REFN. The drain of M3 provides the current I3. The gate of M4 receives the input voltage VINN. The drain of M4 provides the current I4. The PMOS transistor MB is coupled between the sources of M3 and M4 and the power supply voltage VDDA. The gate of MB receives a constant bias voltage VBB; therefore MB operates as a current source and provides a constant current IB. IB=I3+I4.

When the input voltage VINN becomes smaller than the reference voltage REFN, the current I4 increases because the source-to-gate voltage of M4 becomes larger. Accordingly, the current I3 decreases because the sum of the currents I3 and I4 is the constant current IB. On the other hand, when the input voltage VINN becomes larger than the reference voltage REFN, the current I4 decreases because the source-to-gate voltage of M4 becomes smaller. Accordingly, the current I3 increases because the sum of the currents I3 and I4 is the constant current IB. In summary, the current difference (I3−I4) is directly proportional to the voltage difference (VINN−REFN).

The current mirror 144 includes two NMOS transistors M13 and M14. The current mirror 144 provides the current I8 according to the current I3. The current mirror 145 includes two NMOS transistors M15 and M16. The current mirror 145 provides the current I9 according to the current I4. The current mirror 146 includes two PMOS transistors M9 and M10. The current mirror 146 provides the current I10 according to the current I9.

The buffer 125 generates the output voltage VOUT based on the pull-up current I-UP received by the input end N of the buffer 125 and the pull-down current I-DOWN provided by the input end N of the buffer 125. The pull-up current I-UP includes the currents I7 and I10. The pull-down current I-DOWN includes the currents I6 and I8. Due to the current mirrors 141-146, I1=I5=I6, I2=I7, I3=I8, and I4=I9=I10. Therefore, the pull-up current I-UP is equal to I2+I4 and the pull-down current I-DOWN is equal to I1+I3.

When the pull-up current I-UP is larger than the pull-down current I-DOWN, the pull-up current I-UP charges the input end N of the buffer 125 faster than the pull-down current I-DOWN discharges the input end N of the buffer 125. Therefore, the voltage at the input end N rises up to the power supply voltage VDDA. The output voltage VOUT follows the voltage at the input end N and rises up to the power supply voltage VDDA. The buffer 125 boosts the driving capability of the output voltage VOUT. When the pull-up current I-UP is smaller than the pull-down current I-DOWN, the pull-down current I-DOWN discharges the input end N of the buffer 125 faster than the pull-up current I-UP charges the input end N of the buffer 125. Therefore, the voltage at the input end N falls down to the ground voltage. The output voltage VOUT follows the voltage at the input end N and falls down to the ground voltage.

From the discussions above, it can be seen that the increment rate of the output voltage VOUT is directly proportional to the current difference (I-UP−I-DOWN) and the current difference (I-UP−I-DOWN) is equal to (I7+I10)−(I6+I8). From the current mirrors 141-146 and the resultant equivalence of the related currents, it can be seen that the current difference (I-UP−I-DOWN) is equal to (I2+I4)−(I1+I3). From the discussions of the differential amplifiers 121 and 122 above, it can be seen that the current difference (I2−I1) is directly proportional to the voltage difference (VINP−REFP) and the current difference (I3−I4) is directly proportional to the voltage difference (VINN−REFN). In summary, the following derivations (1)-(4) can be obtained from the discussions above.

(1) The increment rate of the output voltage VOUT is directly proportional to (VINP−REFP)+(REFN−VINN).

(2) Alternatively, the increment rate of the output voltage VOUT is directly proportional to (VINP−VINN)−(REFP−REFN)=V2−V1.

(3) The decrement rate of the output voltage VOUT is directly proportional to (REFP−VINP)+(VINN−REFN).

(4) Alternatively, the decrement rate of the output voltage VOUT is directly proportional to (REFP−REFN)−(VINP−VINN)=V1−V2.

V1 is the valid range of V2 because the difference V2 between the input voltages VINP and VINN is expected to be smaller than the difference V1 between the reference voltages REFP and REFN.

Figure 2:
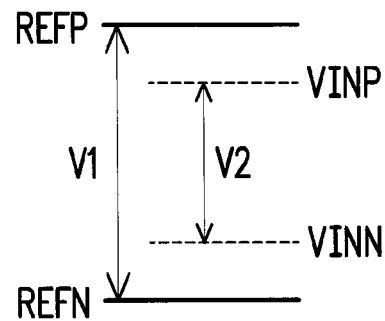
FIG. 2 to FIG. 6 are schematic diagrams showing differential input voltages of a voltage sensing circuit and their valid range according to an embodiment of the present invention.

FIG. 2 is a schematic diagram showing the differential input voltages VINP and VINN of the voltage sensing circuit 100 and the valid range of the difference between the input voltages VINP and VINN defined by the differential reference voltages REFP and REFN according to an embodiment of the present invention. In this embodiment, the input voltage VINP is lower than the reference voltage REFP and the input voltage VINN is higher than the reference voltage REFN. The difference V2 between the input voltages VINP and VINN is smaller than the difference V1 between the reference voltages REFP and REFN. According to derivation (4) above, the output voltage VOUT falls down to the ground voltage, which indicates that the difference V2 between the differential input voltages is in the valid range V1.

Figure 3:
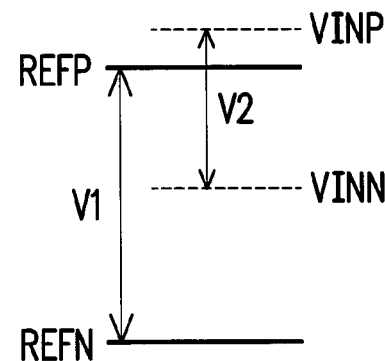

FIG. 3 is a schematic diagram showing the differential input voltages VINP and VINN of the voltage sensing circuit 100 and the valid range V1 defined by the differential reference voltages REFP and REFN according to another embodiment of the present invention. In this embodiment, the input voltage VINP is higher than the reference voltage REFP and the input voltage VINN is higher than the reference voltage REFN. The difference V2 between the input voltages VINP and VINN is still smaller than the valid range V1. According to derivation (4) above, the output voltage VOUT falls down to the ground voltage, which indicates that the difference V2 between the differential input voltages is in the valid range V1.

Figure 4:
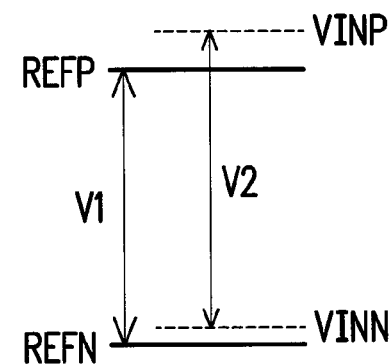

FIG. 4 is a schematic diagram showing the differential input voltages VINP and VINN of the voltage sensing circuit 100 and the valid range V1 defined by the differential reference voltages REFP and REFN according to another embodiment of the present invention. In this embodiment, the input voltage VINP is higher than the reference voltage REFP and the input voltage VINN is higher than the reference voltage REFN. However, the difference V2 between the input voltages VINP and VINN is larger than the valid range V1. According to derivation (2) above, the output voltage VOUT rises up to the power supply voltage VDDA, which indicates that the difference V2 between the differential input voltages is out of the valid range V1.

Figure 5:
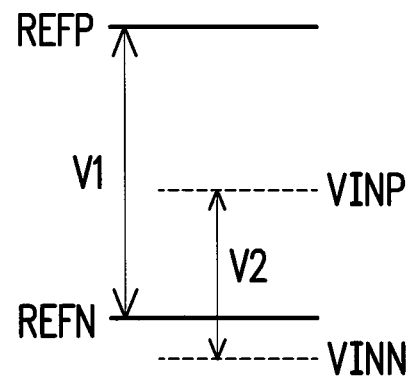

FIG. 5 is a schematic diagram showing the differential input voltages VINP and VINN of the voltage sensing circuit 100 and the valid range V1 defined by the differential reference voltages REFP and REFN according to another embodiment of the present invention. In this embodiment, the input voltage VINP is lower than the reference voltage REFP and the input voltage VINN is also lower than the reference voltage REFN. The difference V2 between the input voltages VINP and VINN is smaller than the valid range V1. According to derivation (4) above, the output voltage VOUT falls down to the ground voltage, which indicates that the difference V2 between the differential input voltages is in the valid range V1.

Figure 6:
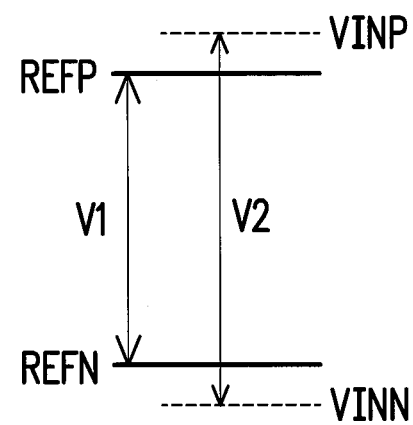

FIG. 6 is a schematic diagram showing the differential input voltages VINP and VINN of the voltage sensing circuit 100 and the valid range V1 defined by the differential reference voltages REFP and REFN according to another embodiment of the present invention. In this embodiment, the input voltage VINP is higher than the reference voltage REFP and the input voltage VINN is lower than the reference voltage REFN. The difference V2 between the input voltages VINP and VINN is larger than the valid range V1. According to derivation (2) above, the output voltage VOUT rises up to the power supply voltage VDDA, which indicates that the difference V2 between the differential input voltages is out of the valid range V1.

Figure 7:
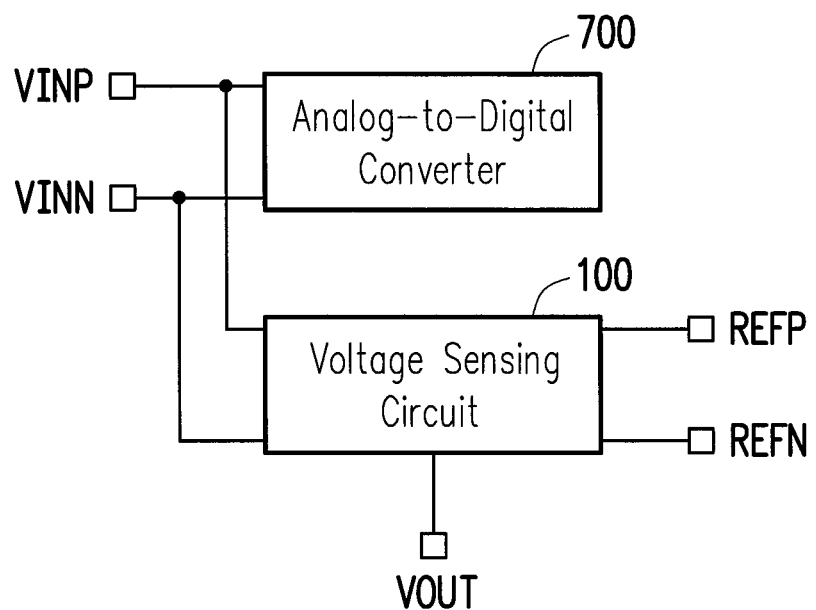
FIG. 7 is a schematic diagram showing an application of a voltage sensing circuit according to an embodiment of the present invention.

FIG. 7 is a schematic diagram showing an application of the voltage sensing circuit 100 according to an embodiment of the present invention. In this embodiment, the voltage sensing circuit 100 is coupled to the analog-to-digital converter (ADC) 700. The differential input voltages VINP and VINN are input to both of the ADC 700 and the voltage sensing circuit 100. The differential reference voltages REFP and REFN define the valid range of the difference between the differential input voltages VINP and VINN of the ADC 700. The voltage sensing circuit 100 checks whether or not the difference between VINP and VINN is in the valid range and generates the output voltage VOUT to indicate the result of the checking. When the output voltage VOUT falls down to the ground voltage, it means the differential voltages VINP and VINN are in the valid range and the ADC 700 can operate properly. When the output voltage VOUT rises up to the power supply voltage VDDA, it means the differential voltages VINP and VINN are out of the valid range and the ADC 700 cannot operate properly. The other components of the system may prepare for the abnormal condition according to the output voltage VOUT.

The application with an ADC is just an example. In addition, the voltage sensing circuit 100 is applicable to any electronic circuit as long as the electronic circuit receives differential input voltages and expects the difference between the input voltages to be in a valid range.

In summary, the present invention provides a simple and efficient voltage sensing circuit capable of checking whether a pair of differential input voltages conforms to a valid range or not.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A voltage sensing circuit, comprising:
    a first differential amplifier receiving a first input voltage and a first reference voltage and providing a first current and a second current according to a difference between the first input voltage and the first reference voltage;
    a second differential amplifier receiving a second input voltage and a second reference voltage and providing a third current and a fourth current according to a difference between the second input voltage and the second reference voltage; and
    a buffer coupled to the first differential amplifier and the second differential amplifier and generating an output voltage based on the first current, the second current, the third current, and the fourth current,
    wherein the buffer generates the output voltage based on a pull-up current received by an input end of the buffer and a pull-down current provided by the input end of the buffer, the pull-up current is equal to the second current plus the fourth current, and the pull-down current is equal to the first current plus the third current.

2. The voltage sensing circuit of claim 1, wherein a difference between the second current and the first current is directly proportional to the difference between the first input voltage and the first reference voltage, and a difference between the third current and the fourth current is directly proportional to the difference between the second input voltage and the second reference voltage.

3. The voltage sensing circuit of claim 2, wherein the first differential amplifier comprises:
    a first transistor, a gate of the first transistor receiving the first reference voltage and a drain of the first transistor providing the first current;
    a second transistor, a gate of the second transistor receiving the first input voltage and a drain of the second transistor providing the second current; and
    a first current source coupled between sources of the first transistor and the second transistor and a ground;
    and wherein the second differential amplifier comprises:
    a third transistor, a gate of the third transistor receiving the second reference voltage and a drain of the third transistor providing the third current;
    a fourth transistor, a gate of the fourth transistor receiving the second input voltage and a drain of the fourth transistor providing the fourth current; and
    a second current source coupled between a power supply voltage and sources of the third transistor and the fourth transistor.

4. The voltage sensing circuit of claim 1, further comprising:
    a first current mirror coupled to the first differential amplifier and providing a fifth current according to the first current;
    a second current mirror coupled to the first current mirror and providing a sixth current according to the fifth current;
    a third current mirror coupled to the first differential amplifier and providing a seventh current according to the second current;
    a fourth current mirror coupled to the second differential amplifier and providing an eighth current according to the third current;
    a fifth current mirror coupled to the second differential amplifier and providing a ninth current according to the fourth current; and
    a sixth current mirror coupled to the fifth current mirror and providing a tenth current according to the ninth current;
    wherein the pull-up current comprises the seventh current and the tenth current, and the pull-down current comprises the sixth current and the eighth current.

5. The voltage sensing circuit of claim 1, wherein the output voltage rises up when the pull-up current is larger than the pull-down current, and the output voltage falls down when the pull-up current is smaller than the pull-down current.

6. The voltage sensing circuit of claim 1, wherein the output voltage falls down to a ground voltage when a difference between the first input voltage and the second input voltage is smaller than a difference between the first reference voltage and the second reference voltage, and the output voltage rises up to a power supply voltage when the difference between the first input voltage and the second input voltage is larger than the difference between the first reference voltage and the second reference voltage.

7. The voltage sensing circuit of claim 1, wherein the first input voltage and the second input voltage are differential input voltages of an analog-to-digital converter, and the first reference voltage and the second reference voltage define a valid range of a difference between the differential input voltages of the analog-to-digital converter.

* * * * *